(12) United States Patent
Mastantuono et al.

(10) Patent No.: US 10,897,263 B1
(45) Date of Patent: Jan. 19, 2021

(54) MULTIPLE PATHS BOOTSTRAP CONFIGURATION FOR SAMPLE AND HOLD CIRCUIT

(71) Applicant: Telefonaktiebolaget LM Ericsson (publ), Stockholm (SE)

(72) Inventors: Daniele Mastantuono, Lund (SE); Sunny Sharma, Malmö (SE); Lars Sundström, Södra Sandby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/874,127

(22) Filed: May 14, 2020

(51) Int. Cl.
  *H04B 3/00* (2006.01)
  *H03M 1/12* (2006.01)
  (Continued)

(52) U.S. Cl.
  CPC ........... *H03M 1/1245* (2013.01); *G11C 27/02* (2013.01); *H03K 17/6871* (2013.01); *H03M 1/38* (2013.01); *H04B 1/40* (2013.01)

(58) Field of Classification Search
  CPC .. H03M 1/1245; H03M 1/38; H03K 17/6871; G11C 27/02; H04B 1/40
  (Continued)

(56) References Cited

U.S. PATENT DOCUMENTS

| | | |
|---|---|---|
| 7,397,284 B1 | 7/2008 | Liu |
| 2009/0102517 A1* | 4/2009 | Setterberg ............... G11C 27/02 327/94 |

(Continued)

FOREIGN PATENT DOCUMENTS

| | | |
|---|---|---|
| EP | 2779451 B1 | 10/2017 |
| JP | 2013229850 A | 11/2013 |

OTHER PUBLICATIONS

Chen, H. et al., "A High-performance Bootstrap Switch for Low Voltage Switched-Capacitor Circuits", 2014 IEEE International Symposium on Radio-Frequency Integration Technology, Sep. 2014, pp. 1-3.

(Continued)

*Primary Examiner* — Don N Vo
(74) *Attorney, Agent, or Firm* — Coats & Bennett, PLLC

(57) ABSTRACT

A multipath bootstrapped sampling circuit includes a sampling capacitor, a sampling transistor interposed between the sampling capacitor and the analog input signal voltage, two bootstrap capacitors, and a bootstrap switching network periodically transitioning between a holding phase and a tracking phase. The bootstrap switching network includes a primary bootstrap path that drives only one load: the gate terminal of the sampling transistor. One or more auxiliary bootstrap paths drive other transistors in the bootstrap switching network. This absolutely minimizes the parasitic capacitance due to fan-out on the primary bootstrap path. Additionally, the provision of two (or more) bootstrap capacitors allows bulk terminals of transistors on the primary bootstrap path to be connected to an auxiliary bootstrap path, further reducing parasitic capacitance on the primary bootstrap path. Additional auxiliary bootstrap paths may be added, providing the opportunity to optimize each clock driver to a specific driven transistor. Additional bootstrap capacitors may be added, to distribute the capacitance among auxiliary bootstrap paths. The reduction in parasitic capacitance at the sampling transistor enhances its linearity, and hence accuracy, at very high frequencies.

20 Claims, 8 Drawing Sheets

(51) Int. Cl.
  *H03M 1/38* (2006.01)
  *H04B 1/40* (2015.01)
  *H03K 17/687* (2006.01)
  *G11C 27/02* (2006.01)

(58) Field of Classification Search
  USPC .......................................................... 375/219
  See application file for complete search history.

(56) References Cited

U.S. PATENT DOCUMENTS

| | | | | |
|---|---|---|---|---|
| 2012/0274362 | A1* | 11/2012 | Doris ................... | G11C 27/024 |
| | | | | 327/94 |
| 2016/0027528 | A1* | 1/2016 | Verbruggen ........ | H03M 1/1245 |
| | | | | 341/122 |
| 2019/0305791 | A1* | 10/2019 | Ali ...................... | H03M 1/1033 |

OTHER PUBLICATIONS

Swindlehurst, E. et al., "An 8-bit 10-GHz 21-mW Time-Interleaved SAR ADC With Grouped DAC Capacitors and Dual-Path Bootstrapped Switch", IEEE Solid State Circuits Letters, Sep. 2019, pp. 83-86, vol. 2, No. 9.
Ramkaj, A. et al., "A 1.25-GS/s 7-b SAR ADC With 36A-dB SNDR at 5 GHz Using Switch-Bootstrapping, USPC DAC and Triple-Tail Comparator in 28.nm CMOS", IEEE Journal of Solid State Circuits, Jul. 2018, pp. 1889-1901, vol. 53, No. 7.
Wang, L. et al., "A High-Speed High-Resolution Low-Distortion CMOS Bootstrapped Switch", 2007 IEEE International Symposium on Circuits and Systems, May 27-30, 2007, pp. 1-4.

\* cited by examiner

MULTIPLE PATHS BOOTSTRAP CONFIGURATION FOR SAMPLE AND HOLD CIRCUIT

FIELD OF INVENTION

The present invention relates generally to analog to digital converters, and in particular to bootstrapped configurations for sample and hold circuits featuring multiple bootstrap paths.

BACKGROUND

Most modern electronic devices include at least some digital circuits. Technological advances have vastly increased the available processing power and memory density, while lowering the cost of both. While data-handling and computational circuits are naturally digital, even electronic circuits that were traditionally primarily analog—such as communication devices, signal processing circuits, control systems, and the like—now often include significant digital processing, with appropriate domain transformations, i.e., analog-to-digital conversion (ADC), and digital-to-analog conversion (DAC).

As one representative, non-limiting example, consider a modern mobile wireless telecommunication device (e.g., smartphone), also known in the art as User Equipment (UE). Radio frequency signals received at an antenna may be amplified, filtered, and frequency downconverted by analog circuits, and are then converted to the digital domain. Many of the signal processing tasks—such as demodulation, data decoding, decryption, and the like—are performed digitally. The received digital data is processed by application programs, and may be converted to the analog domain and rendered to a speaker or display. Additionally, the device may receive analog signals from a microphone or camera, convert the signals to the digital domain, and perform signal processing operations prior to generating analog RF signals, which are transmitted to the network. Similar RF signal processing tasks occur in the base station, also known as an eNodeB or gNB, of the wireless communication network—i.e., analog RF signals received at one or more antennas may be processed by analog circuits, and are then digitized for further processing, storage, transmission, and the like.

Increasingly high bandwidth and data rates impose the requirements of very high speed and accuracy in analog to digital conversion (ADC). For example, 5G networks will not only use spectrum in the existing LTE frequency range of 600 MHz to 6 GHz, but will also operate in millimeter wave bands of 24-86 GHz. Furthermore, given the complexity and scale of electronic circuits of a 5G Advanced Antenna System (AAS) base station with hundreds of transceivers, the power consumption and associated thermal dissipation capability of all circuits, including ADC components, is critical. Accordingly, ADC circuits must have the lowest possible power consumption and allow high integration through area reduction.

One key requirement for high speed and accuracy in an ADC circuit is the linearity of its transfer function. At high frequencies, the linearity of an ADC is limited by the performance of the sampling switch. In particular, an uncompensated solid state switch will exhibit non-linearity resulting from non-linear, signal-dependent modulation of its channel resistance in the conductive state, herein referred to as the ON-resistance. That is, changes in the input signal applied to the source of a MOSFET, with a constant voltage applied to its gate, result in a gate-source voltage $V_{gs}$ that changes with the input. Enhancement of the channel of a MOSFET—and hence the resistance of the channel when the MOSFET is conducting—depends on $V_{gs}$. One known approach to linearize a MOSFET switch is to drive the gate of the transistor with a higher voltage that depends on the input signal, to approach a constant (signal independent) ON-resistance. For a constant supply voltage $V_{DD}$ and dynamic input signal voltage $V_{in}$, if the voltage applied to the gate of a transistor is $V_{DD} V_{in}$ and the input signal voltage $V_{in}$ is applied at its source, then the gate-to-source voltage $V_{gs}$ is $$V_{gs} = V_g - V_s = (V_{DD} + V_{in}) - V_{in} = V_{DD}$$

which is a constant, resulting in a stable ON-resistance. This technique is known as bootstrapping. See, e.g., Marcel Pelgrom, *Analog-to-Digital Conversion*, § 4.3.4 CMOS Bootstrap Techniques (Springer Science & Business Media, 2012), the disclosure of which is incorporated herein by reference. Bootstrap circuits solve two problems associated with a one-transistor switch: the limited input range due to the threshold voltage, and the switch resistance variation. Bootstrap circuits improve performance in both respects by increasing the effective gate voltage beyond the power supply limits.

At high frequencies, however, conventional bootstrapped ADC circuits still exhibit non-linearity, due to parasitic capacitance resulting from a high fan-out of connections in the bootstrap path, and the bulk connections of numerous transistors in the circuit.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, a multipath bootstrapped sampling circuit includes a sampling transistor, two bootstrap capacitors, and a switching network periodically transitioning between a holding phase and a tracking phase. The switching network includes a primary bootstrap path that drives only one load: the gate terminal of the sampling transistor. One or more auxiliary bootstrap paths drive other transistors in the switching network. This absolutely minimizes the parasitic capacitance due to fan-out on the primary bootstrap path. Additionally, the provision of two (or more) bootstrap capacitors allows bulk terminals of transistors on the primary bootstrap path to be connected to an auxiliary bootstrap path, further reducing parasitic capacitance on the primary bootstrap path. Additional auxiliary bootstrap paths may be added, providing the opportunity to optimize each clock driver to a specific driven transistor. Additional bootstrap capacitors may be added, to distribute the capacitance among auxiliary bootstrap paths. The reduction in parasitic capacitance at the sampling transistor enhances its linearity, and hence accuracy, at very high frequencies.

One embodiment relates to a multipath bootstrapped sampling circuit for an analog to digital converter. The multipath bootstrapped sampling circuit receives a supply voltage and periodic clock signal, and has a ground. It samples an analog input signal voltage, and outputs a sampled voltage value. The multipath bootstrapped sampling circuit includes a sampling capacitor and a sampling transistor interposed between the sampling capacitor and the analog input signal voltage; first and second bootstrap capacitors; and a bootstrap switching network configured to periodically transition between a holding phase and a tracking phase in response to the periodic clock signal. The bootstrap switching network is configured to, in the holding phase, charge the capacitors to the supply voltage by connecting them between the supply voltage and ground, and apply ground to a gate terminal of the sampling transistor. The bootstrap switching network is configured to, in the tracking phase, disconnect the capacitors from the supply voltage and apply the sum of the first capacitor voltage and analog input signal voltage to the gate terminal of the sampling transistor. The bootstrap switching network includes a primary bootstrap path connected to the first bootstrap capacitor and driving only the sampling transistor gate terminal; and at least a first auxiliary bootstrap path driving gate terminals of one or more other transistors in the bootstrap switching network.

Another embodiment relates to a method of repeatedly sampling an input signal voltage by a multipath bootstrapped sampling circuit for an analog to digital converter. The sampling circuit receives a supply voltage and periodic clock signal, has a ground, and outputs a sampled voltage value. The multipath bootstrapped sampling circuit includes a sampling capacitor, a sampling transistor interposed between the sampling capacitor and the analog input signal voltage, first and second bootstrap capacitors, and a bootstrap switching network comprising a primary bootstrap path and at least a first auxiliary bootstrap path. In a holding phase of the bootstrap switching network, the capacitors are charged to the supply voltage by connecting them between the supply voltage and ground, and ground is applied to a gate terminal of the sampling transistor by the primary bootstrap path. In a tracking phase of the bootstrap switching network, the capacitors are disconnected from the supply voltage and the sum of the first capacitor voltage and analog input signal voltage is applied to the gate terminal of the sampling transistor by the primary bootstrap path. The primary bootstrap path drives only the gate terminal of the sampling transistor. The first auxiliary bootstrap path drives the gate terminals of one or more transistors in the bootstrap switching network that connect bootstrap capacitors to the supply voltage.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 1:
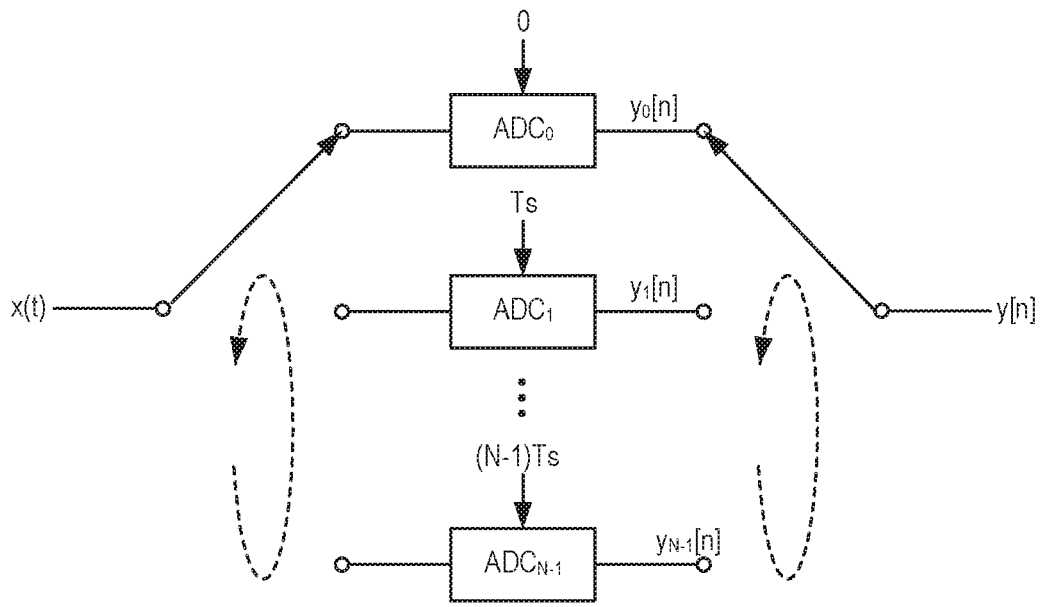
FIG. 1 is a conceptual block diagram of a time-interleaved analog to digital converter.

FIG. 1 depicts the concept of time-interleaved Analog to Digital Converter (ADC). A continuous time signal x(t) is converted to a digital signal y(n) using N sub-ADCs. Each sub-ADC converts the data to a sampling frequency 1/N that of the digital output y(n).

Figure 2:
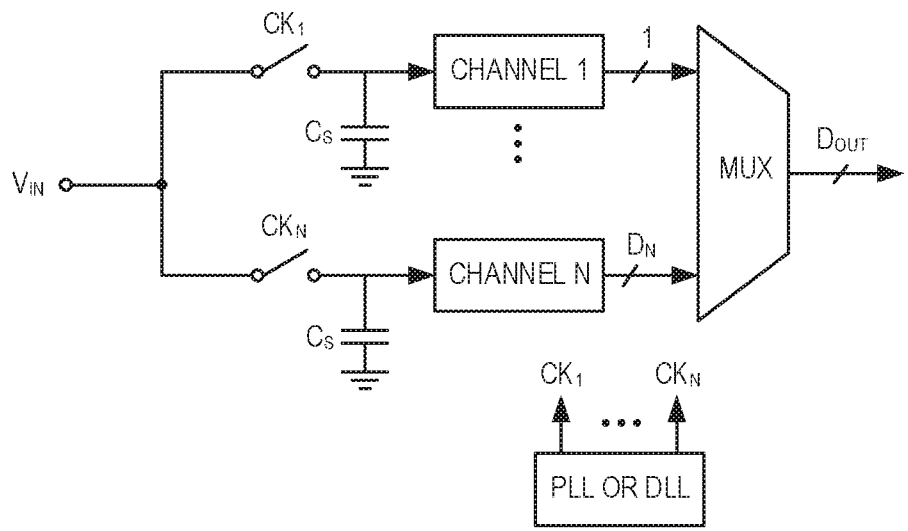
FIG. 2 is a functional block diagram of a time-interleaved ADC.

FIG. 2 shows a conventional circuit used to implement the time-interleaved ADC concept of FIG. 1. Each sub-ADC comprises a channel and a sampling input circuit. The sampling input circuit is represented with an ideal switch and a sampling capacitance. An input signal $V_{in}$ is rotated through the sub-ADCs by actuating the switches using successive clock signals $CK_1 \ldots CK_N$. The digital outputs of each sub-ADC are multiplexed to yield the digital output $D_{out}$.

A known limitation of ADC implementation is the Signal to Noise and Distortion Ratio (SNDR) that can be obtained, due to nonlinearity of the sampling switches. To achieve high resolution (e.g., 9 bits or more), the sampling switch must be linearized. As discussed above, one known approach to linearize a switch is to drive the gate of a transistor with a higher voltage that depends on the input signal, to approach a constant (signal independent) on-resistance.

Figure 3:
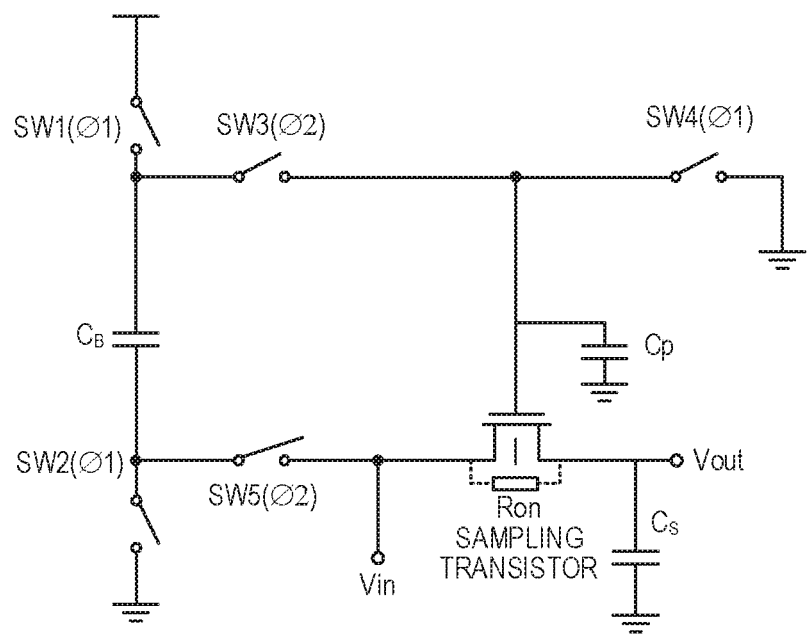
FIG. 3 is an idealized diagram of a sampling circuit.

FIG. 3 depicts a conceptual view of one technique to bootstrap an ADC sampling transistor, as described by Hongmei Chen, et al., in "A High-performance bootstrap Switch for Low Voltage Switched-Capacitor Circuits," 2014 IEEE International Symposium on Radio-Frequency Integration Technology (2014), the disclosure of which is incorporated by reference herein in its entirety. FIG. 3 depicts a bootstrap capacitor $C_B$; the sampling transistor, with parasitic capacitance $C_p$ and equivalent ON resistance $R_{on}$; and idealized switches SW1-SW5, operated by different phases of a clocking signal. During a first phase Φ1 of the clock signal (also known as a holding phase), switches SW1, SW2, and SW4 are closed, and switches SW3 and SW5 are open. This connects the bootstrap capacitor $C_B$ across the supply voltage, charging it, and grounds the gate of the sampling transistor, turning it OFF. This disconnects the sampling capacitor $C_S$ from the input voltage $V_{in}$.

During the alternate phase Φ2 of the clock (also known as the tracking phase), switches SW1 and SW2 open, disconnecting the bootstrap capacitor $C_B$ from the supply voltage, and switch SW4 opens to remove the ground from the gate of the transistor. Meanwhile, switches SW3 and SW5 close, connecting the bootstrap capacitor $C_B$ between the source terminal of the sampling transistor, where the input voltage $V_{in}$ is applied, and the gate terminal. This turns the sampling transistor, connecting the sampling capacitor $C_S$ to the input voltage $V_{in}$ and charging it to that value. When the clock signal again switches to the holding phase, the sampled input voltage is held on the sampling capacitor $C_S$, and presented as the output voltage $V_{out}$. Note that, when the clock enters the tracking phase, the voltage applied to the gate terminal of the sampling transistor is the sum of the input voltage $V_{in}$ and the voltage on the bootstrap capacitor $C_B$, which is the supply voltage; hence $V_g = V_{DD} V_{in}$. As discussed above, the gate-to-source voltage $V_{gs}$ is $$V_{gs} = V_g - V_s = (V_{DD} + V_{in}) - V_{in} = V_{DD}$$

which is independent of $V_{in}$. Hence, $V_{gs}$, and the transistor equivalent ON-resistance $R_{on}$, is largely constant, and independent of the input signal voltage variations, improving linearity. A major limitation to the ability of the bootstrap circuit to improve the switch's linearity at very high frequencies is the parasitic capacitance $C_p$.

Figure 4:
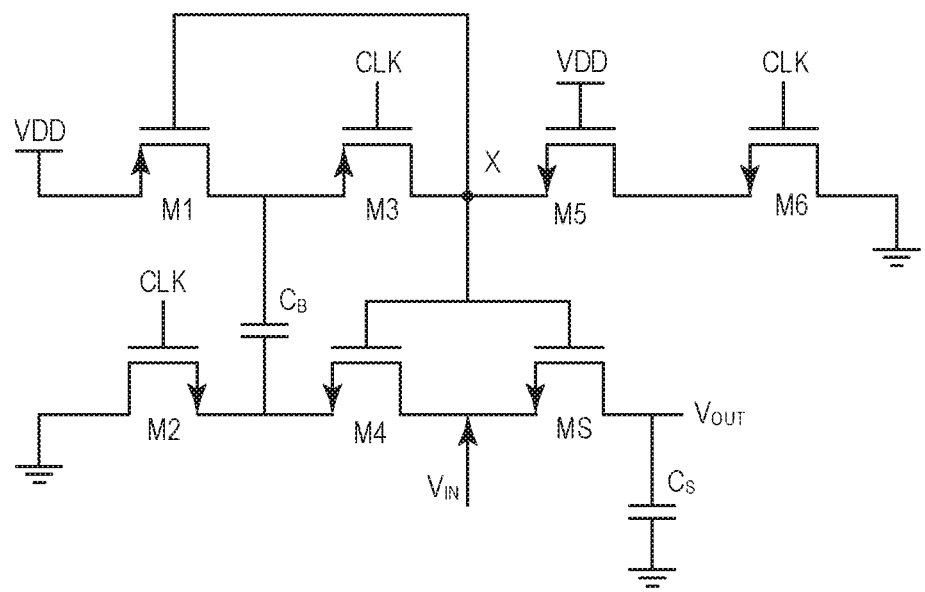
FIG. 4 is a schematic diagram of a circuit implementing the sampling circuit of FIG. 1.

FIG. 4 depicts a schematic implementing the conceptual view of FIG. 3. During the holding phase, when CLK=1, the NMOS switch M6 is ON, pulling the node X to ground. If M6 is ON, the switch M5 is ON; its purpose is to limit the voltage at its drain to less than $2V_{DD}$, providing overvoltage protection to the switch M6. The node X is connected to the gate terminals of M1, M4, and MS. While this turns the NMOS switches M4 and MS OFF, it turns the PMOS switch M1 ON, connecting the upper plate of the bootstrap capacitor $C_B$ to $V_{DD}$. The CLK signal also turns M2 ON, connecting the lower plate of the bootstrap capacitor $C_B$ to ground, and turns M3 OFF, isolating $C_B$ from the gate of the sampling transistor MS. The bootstrap capacitor $C_B$ is thus connected between the power rails, and it charges to $V_{DD}$.

During the tracking phase, when CLK=0, the bootstrap capacitor $C_B$ is disconnected from the power rails and connected through M3 to the node X and hence the gate terminal of both the sampling transistor MS and the transistor M4. The $V_{gs}$ of M4 is thus the voltage on $C_B$, turning M4 ON, and adding the input voltage $V_{IN}$ to the voltage on $C_B$. The sum of the supply voltage (on the bootstrap capacitor $C_B$) and the input voltage $V_{IN}$ is thus applied to the gate of MS. With the sampling transistor MS turned ON, the voltage on the sampling capacitor $C_S$ tracks the input voltage $V_{IN}$, and at the rising edge of CLK, MS turns off and the sampled voltage on $C_S$ is output as $V_{OUT}$. The circuit thus operates over one complete period of the CLK signal—charging the bootstrap capacitor in the holding phase, and tracking the input in the tracking phase. Adding the input voltage to the supply voltage at the gate of the sampling transistor MS holds $V_{gs}$ of that switch constant, minimizing modulation of the ON-resistance and hence improving linearity.

The parasitic capacitance, modeled as $C_p$ in FIG. 3, arises in the circuit of FIG. 4 primarily due to the large fan-out of node X—driving the gate terminals of three transistors. Additionally, there is some parasitic capacitance at the source and drain of each transistor connected to this node. In bulk technology, the bulk connections of PMOS transistors also contribute parasitic capacitance at the upper plate of $C_B$.

Figure 5:
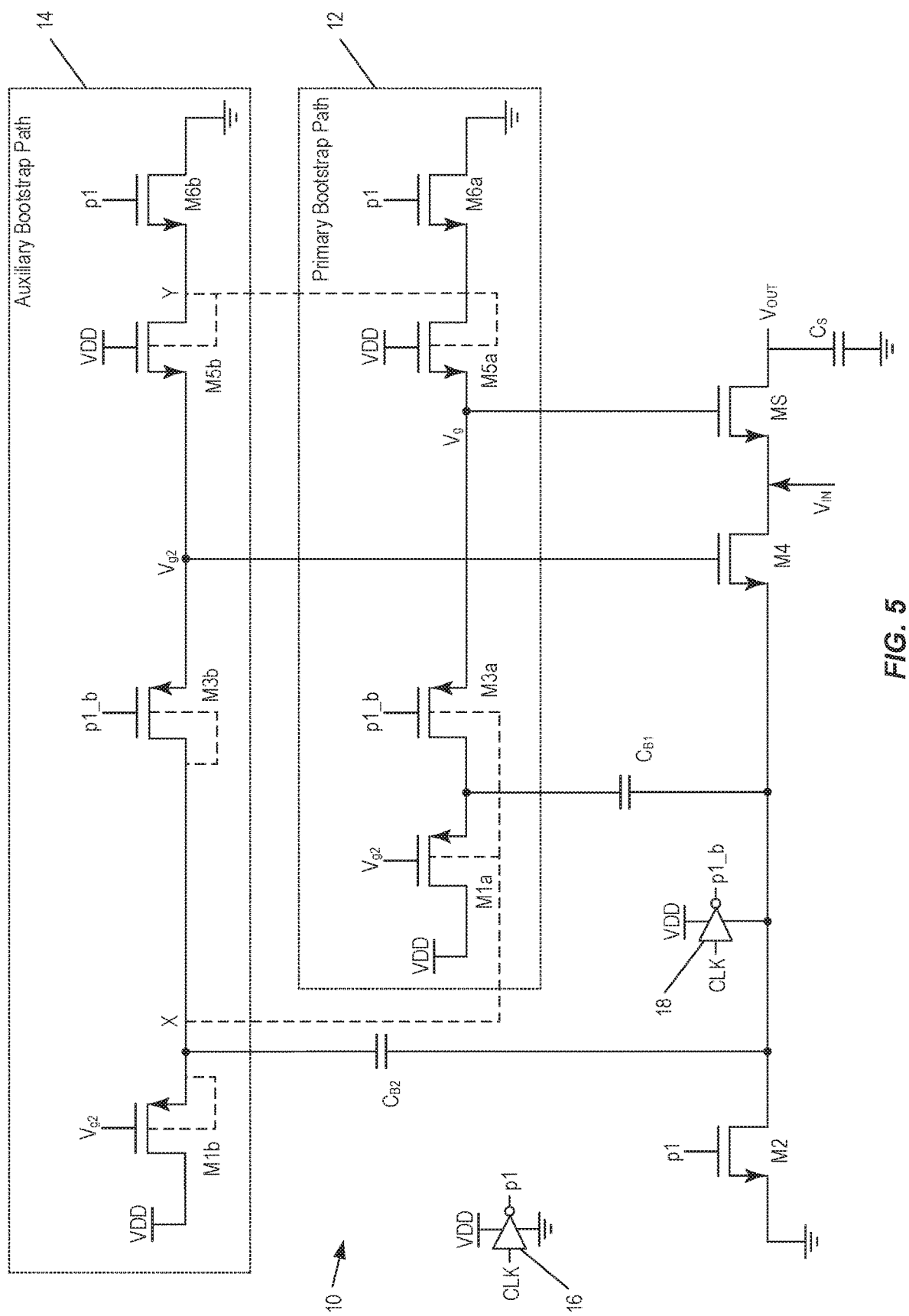
FIG. 5 is a schematic diagram of a multipath bootstrapped sampling circuit having primary and auxiliary bootstrap paths.

FIG. 5 depicts a high frequency, multipath, bootstrapped sampling circuit 10 according to embodiments of the present invention. The multipath bootstrapped sampling circuit 10 operates similarly to the circuit of FIG. 4 described above (the transistors are numbered correspondingly). The multipath bootstrapped sampling circuit 10 receives a supply voltage $V_{DD}$ and periodic clock signal CLK, and it has a ground. The multipath bootstrapped sampling circuit 10 samples an analog input signal voltage $V_{IN}$, and outputs a sampled voltage value $V_{OUT}$. The circuit 10 includes a sampling capacitor $C_S$, a sampling transistor MS interposed between the sampling capacitor $C_S$ and the analog input signal voltage $V_{IN}$. Rather than a single bootstrap capacitor, as depicted in FIG. 4, the multipath bootstrapped sampling circuit 10 includes first and second bootstrap capacitors $C_{B1}$ and $C_{B2}$.

A bootstrap switching network is configured to periodically transition between a holding phase and a tracking phase in response to the periodic clock signal CLK. In the holding phase, the bootstrap switching network is configured to charge the bootstrap capacitors $C_{B1}$, $C_{B2}$ to the supply voltage $V_{DD}$ by connecting them between the supply voltage $V_{DD}$ and ground, and isolate the sampling capacitor $C_S$ by applying ground to a gate terminal of the sampling transistor MS. In the tracking phase, bootstrap switching network is configured to disconnect the bootstrap capacitors $C_{B1}$, $C_{B2}$ from the supply voltage $V_{DD}$ and apply a sum of the first capacitor voltage $C_{B1}$ and analog input signal voltage $V_{IN}$ to the gate terminal of the sampling transistor MS, thereby connecting the sampling capacitor $C_S$ to the analog input voltage $V_{IN}$.

In the multipath bootstrapped sampling circuit 10, the bootstrap switching network includes a primary bootstrap path 12 connected to the first bootstrap capacitor $C_{B1}$ and driving only the gate terminal of the sampling transistor MS, and at least a first auxiliary bootstrap path 14 driving gate terminals of one or more other transistors in the bootstrap switching network, e.g., M1a, M1b, and M4.

A first inverter 16 generates a phase signal p1 from the periodic clock signal CLK. The first inverter 16 is connected between the supply voltage VDD and ground; hence the signal p1 has the same voltage swing as CLK (but is opposite in phase). A second inverter 18 generates a bootstrapping phase signal p1_b from the periodic clock signal CLK. The second inverter 18 is connected between the supply voltage VDD and the bottom plates of the bootstrap capacitors $C_{B1}$, $C_{B2}$. This node is at ground during the holding phase, when p1 is HIGH and M2 is ON. During the tracking phase, however, the node is at $V_{IN}$. This signal p1_b bootstraps the PMOS transistors M3a and M3b by applying $V_{IN}$ at the gate and $V_{DD} V_{IN}$ at the source, keeping the gate to source voltage $V_{gs}$ of these transistors ideally constant, and avoiding modulation of their ON-resistance by the input signal. This improves performance, but requires a specific connection of the bulk terminals of all PMOS transistors, to avoid a gate to bulk voltage $V_{gb}$ overvoltage. Although toggling between different voltage levels, the phase signals p1 and p1_b have the same frequency and they are in phase.

During the holding phase, when p1 and p1_b are HIGH, the transistor M2 connects the lower plates of both bootstrap capacitors $C_{B1}$ and $C_{B2}$ to ground. In the primary bootstrap path 12, the switch M6a pulls node $V_g$ to ground turning OFF the sampling transistor MS (as explained above, the transistor M5a provides overvoltage protection). Similarly, in the auxiliary bootstrap path 14, the switch M6b pulls node $V_{g2}$ to ground. Because both switch M1a in the primary bootstrap path 12 and M1b in the auxiliary bootstrap path 14 are driven by $V_{g2}$, the upper plates of both bootstrap capacitors $C_{B1}$ and $C_{B2}$ are connected to the supply voltage $V_{DD}$. Because p1_b is also HIGH, the bootstrap capacitors $C_{B1}$ and $C_{B2}$ are isolated from the rest of the switching network by M3a in the primary bootstrap path 12 and M3b in the auxiliary bootstrap path 14.

The provision of separate bootstrap capacitors $C_{B1}$ and $C_{B2}$ is necessary to enable the connection of the PMOS bulk terminals of M1a and M3a to node X in the auxiliary bootstrap path 14. This reduces the parasitic capacitance at node Vg in the primary bootstrap path 12, which drives the gate of the switching transistor MS. Reducing parasitic capacitance at this node improves the switching speed, and enables accurate operation at high frequencies. The values of the two bootstrap capacitors $C_{B1}$ and $C_{B2}$ can be optimized to a particular application, and their sum need not exceed the single bootstrap capacitance $C_B$ depicted in FIG. 2. Still further reduction in parasitic capacitance is achieved by also connecting the bulk terminal of NMOS transistor M5a to node Y in the auxiliary bootstrap path 14, along with that of M5b.

During the tracking phase, when p1 and p1_b are LOW, the bootstrap capacitors $C_{B1}$ and $C_{B2}$ are removed from the supply voltage rails by M2, M1a, and M1b. The transistors M6a and M6b turn OFF, and the nodes $V_g$ in the primary bootstrap path 12 and $V_{g2}$ in the auxiliary bootstrap path 14 are connected to the upper plates of bootstrap capacitors $C_{B1}$, $C_{B2}$, respectively. Transistor M4 turns on to add the input signal voltage $V_{IN}$ to the supply voltage on the bootstrap capacitors $C_{B1}$ $C_{B2}$. Hence, both M4 and, critically, MS are bootstrapped by applying $V_{DD}$ $V_{IN}$ at the gate, holding $V_{gs}$ constant and avoiding modulation of the ON-resistance by the input signal, which is a major source of non-linearity. With the switching transistor MS turned ON, the voltage on the sampling capacitor $C_S$ tracks the input voltage $V_{IN}$ throughout the tracking phase. On the rising edge of p1, the gate terminal of MS is again grounded, isolating $C_S$ and presenting its voltage as the output voltage $V_{OUT}$.

While the node $V_{g2}$ in the auxiliary bootstrap path 14 has a fan-out of three (the gates of transistors M4, M1a, and M1b), the node $V_g$ in the primary bootstrap path 12 drives only one load: the gate terminal of the sampling transistor MS. This minimization of fan-out minimizes the parasitic capacitance ($C_p$ in FIG. 3) that constrains the operation of MS at high frequency.

Hence, at least one auxiliary bootstrap path 14 allows the primary bootstrap path 12 to have the minimum fan-out of one (the gate terminal of the sampling transistor MS), and also to offload bulk terminal connections. Both of these aspects reduce parasitic capacitance, which limits performance of the sampling transistor MS at high frequencies. However, the invention is not limited to a single auxiliary bootstrap path 14.

Figure 6:
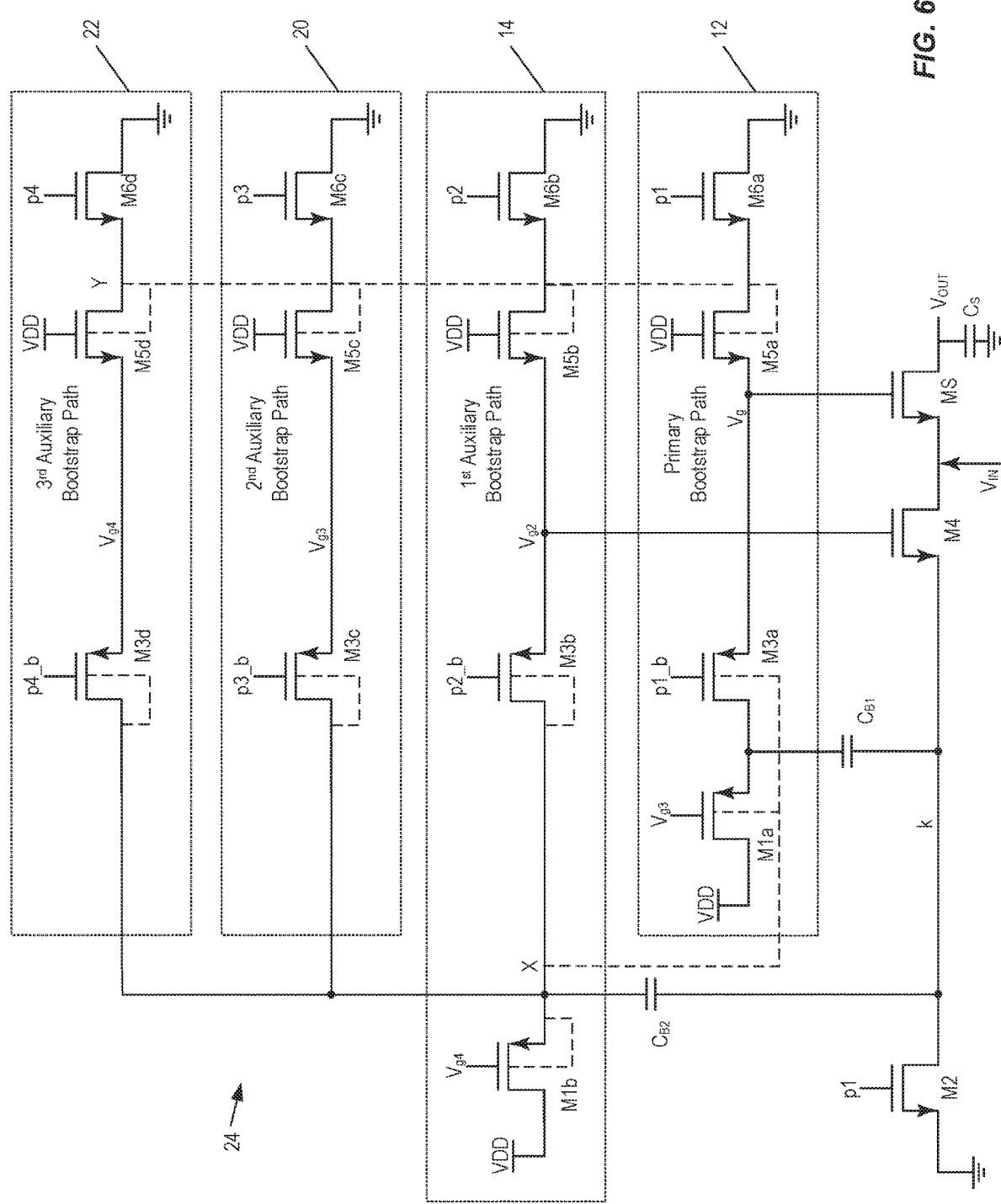
FIG. 6 is a schematic diagram of a multipath bootstrapped sampling circuit having a plurality of auxiliary bootstrap paths.

FIG. 6 depicts an embodiment of a multipath bootstrapped sampling circuit 24 having more than one auxiliary bootstrap path 14, 20, 22. In fact, the multipath bootstrapped sampling circuit 24 of FIG. 6 has the maximum number of auxiliary bootstrap paths 14, 20, 22 for this design—where each transistor M4, M1a, M1b in the bootstrap switching network that is driven by a clock signal has a dedicated associated auxiliary bootstrap path 14, 20, 22. In particular, as described with respect to the embodiment of FIG. 5, the first auxiliary bootstrap path 14 generates the periodic signal $V_{g2}$, which drives the gate terminal of the transistor M4. Additionally, a second auxiliary bootstrap path 20 generates the periodic signal $V_{g3}$, which drives the gate terminal of the transistor M1a in the primary bootstrap path 12 (which connects the bootstrap capacitor $C_{B1}$ to $V_{DD}$ in holding phases). Further, a third auxiliary bootstrap path 22 generates the periodic signal $V_{g4}$, which drives the gate terminal of the transistor M1b in the first auxiliary bootstrap path 14 (which connects the bootstrap capacitor $C_{B2}$ to $V_{DD}$ in holding phases).

Each auxiliary bootstrap path 14, 20, 22 can be optimized, depending on the size of the transistor being driven. Additionally, separately generating each clock signal improves robustness, with better isolation between holding and tracking phases, since overlap between tracking and holding phase can be avoided by design. In various embodiments, one, two, or more auxiliary bootstrap paths 14, 20, 22 may be deployed. Those of skill in the art may readily determine the appropriate number of auxiliary bootstrap paths 14, 20, 22 for any given application, depending on the design constraints and performance requirements, given the teachings of the present disclosure.

Although not on the critical path of the sampling transistor MS, the node X in the first auxiliary bootstrap path 14 is capacitively loaded by both the bootstrap capacitor $C_{B2}$ and the bulk terminal connections from transistors M1a and M3a in the primary bootstrap path 12, which may impact its performance at high frequencies.

Figure 7:
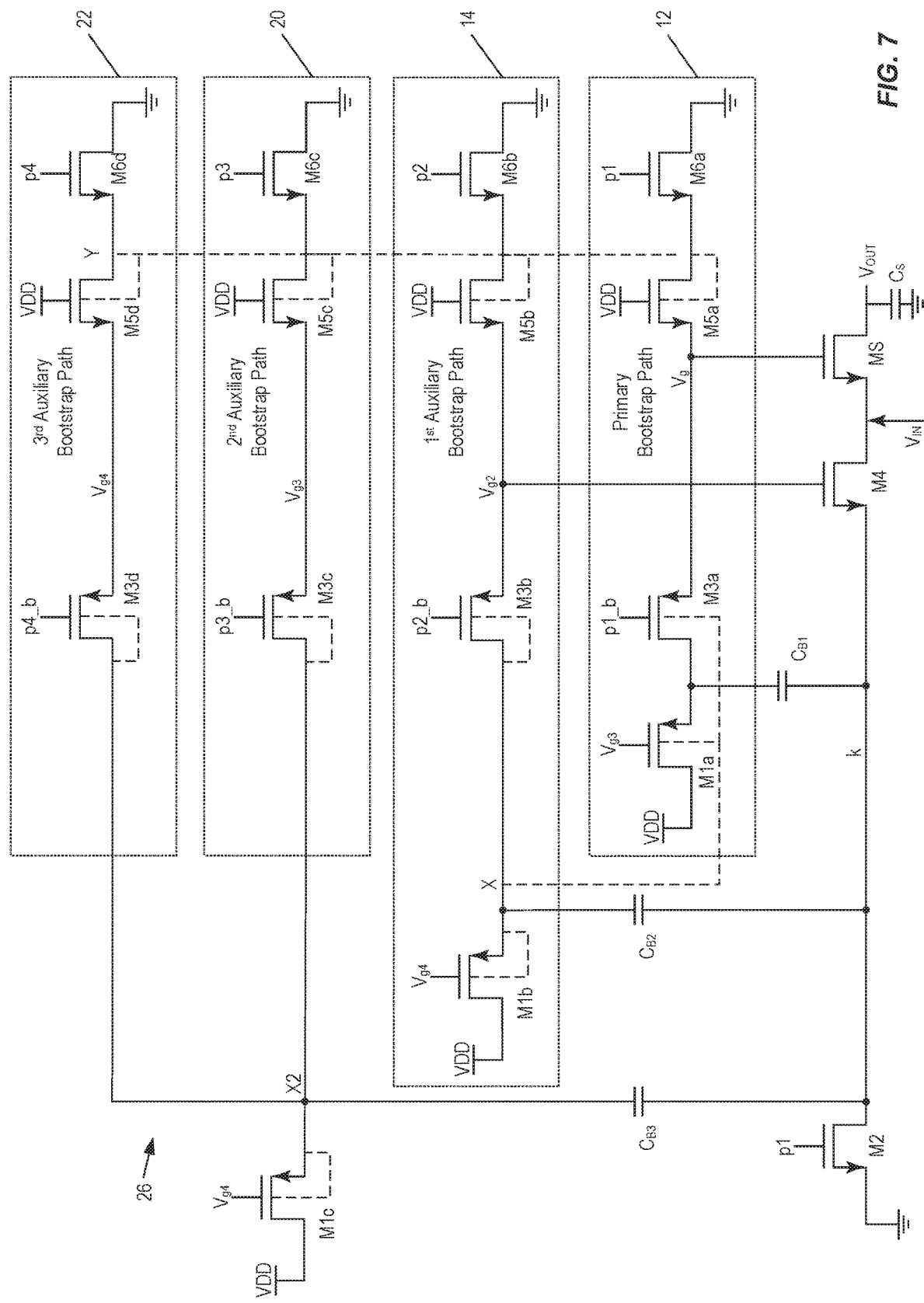
FIG. 7 is a schematic diagram of a multipath bootstrapped sampling circuit having a plurality of auxiliary bootstrap paths and a plurality of bootstrap capacitors.

FIG. 7 depicts an embodiment of a multipath bootstrapped sampling circuit 26, in which the capacitive load at node X in FIG. 6 is split between node X and node X2 in the second auxiliary bootstrap path 20. This is accomplished by introducing a third bootstrap capacitor $C_{B3}$. The bulk terminal connections between nodes X and X2 as depicted in FIG. 7 are a non-limiting example. In general, the number and location of bulk terminal connections between the nodes is a design variable, which may vary depending on the design constraints and performance requirements of any given application.

Figure 8:
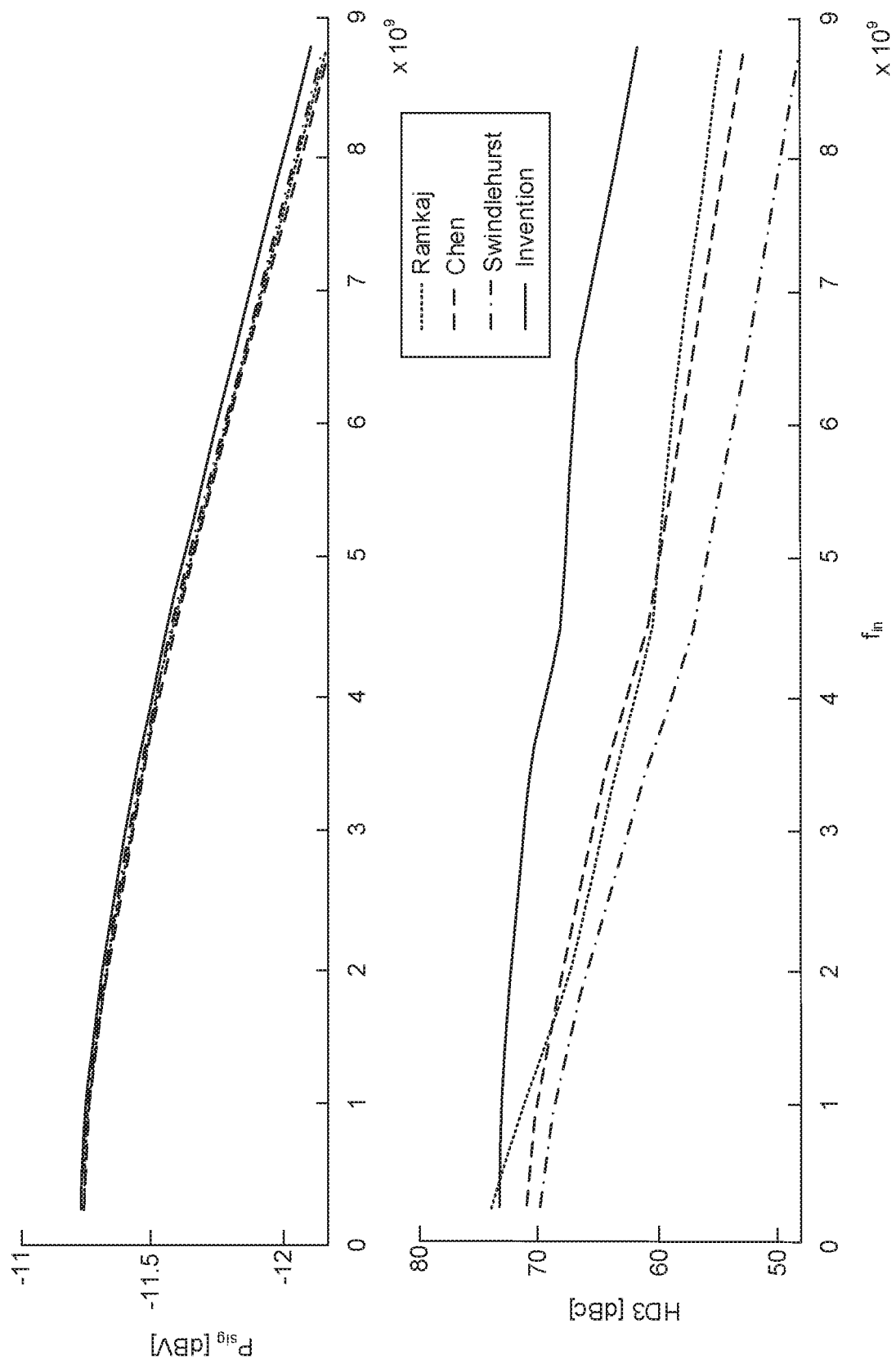
FIG. 8 is a graph of simulations of the multipath bootstrapped sampling circuit of FIG. 5 and three prior art bootstrapped sampling circuits.

FIG. 8 depicts the results of simulations of the multipath bootstrapped sampling circuit 10 (FIG. 5) and three prior art bootstrapped sampling circuits. The upper graph shows the power, and the lower graph the third harmonic distortion, vs. input frequency, for a clock frequency of 5 GHz. The inventive multipath bootstrapped sampling circuit 10, indicated by a solid line, show significant improvement over the prior art at high input frequency. The dashed line shows the performance of a basic bootstrapped circuit similar to that depicted in FIGS. 3 and 4, as described by Hongmei Chen, et al., in "A High-performance bootstrap Switch for Low Voltage Switched-Capacitor Circuits," 2014 IEEE International Symposium on Radio-Frequency Integration Technology (2014). The dotted line shows the performance of a bootstrapped sampling circuit having an alternate control mechanism for connecting the sampling transistor to the bootstrap capacitance, as described by Athanasois Ramkaj, et al., in "A 1.25-GS/s 7-b SAR ADC With 36.4-dB SNDR at 5 GHz Using Switch-Bootstrapping, USPC DAC and Triple-Tail Comparator in 28-nm CMOS," IEEE Journal of Solid-state Circuits, V. 53, No. 7 (July 2018). Finally, the dashed and dotted line shows the performance of a bootstrapped sampling circuit having dual bootstrap capacitors, as described by Eric Swindlehurst, et al., in "An 8-bit 10-GHz 21-mW Time-Interleaved SAR ADC with Grouped DAC Capacitors and Dual-Path Bootstrapped Switch," IEEE Solid-state Circuits Letters, V. 2, No. 9 (September 2019).

Figure 9:
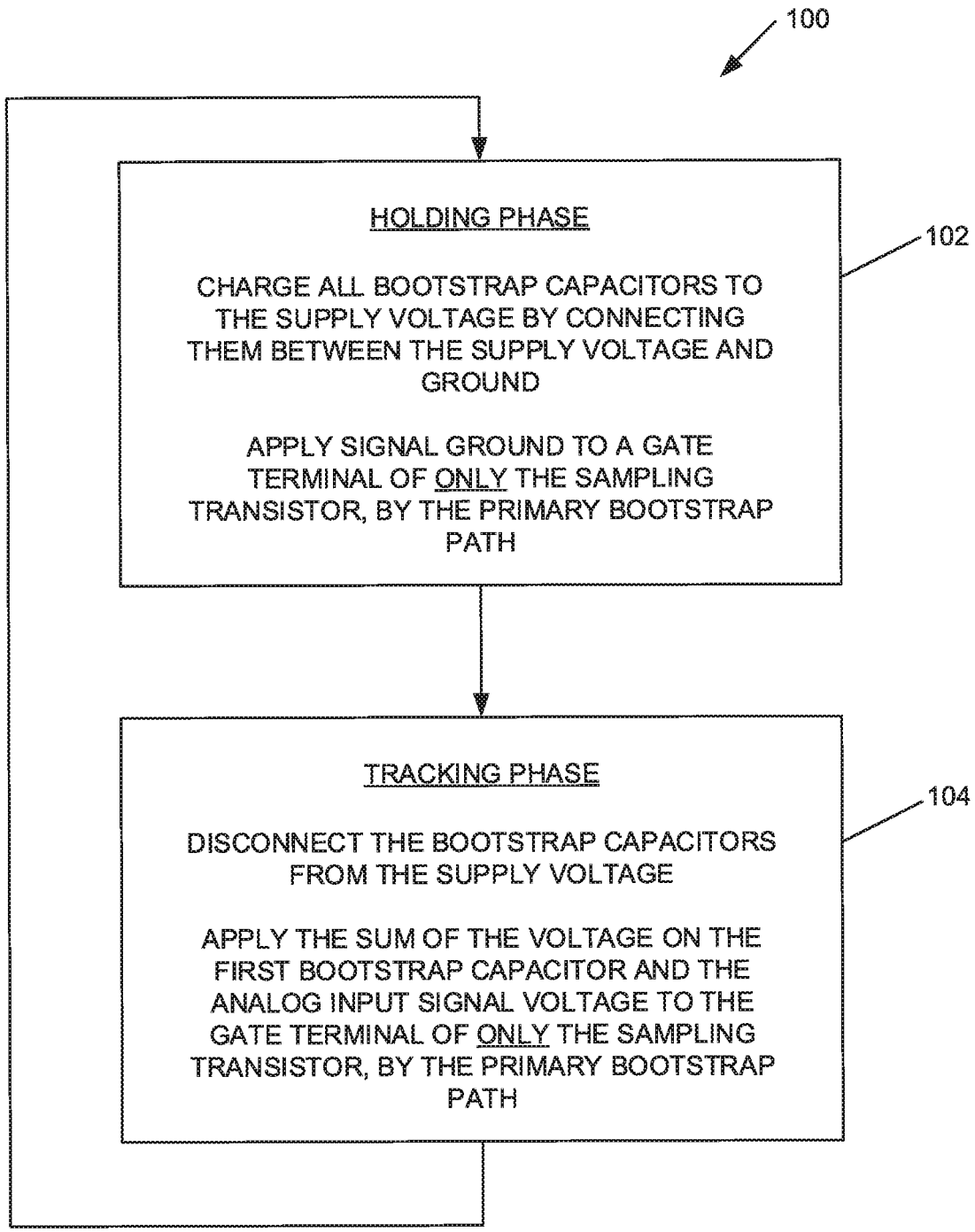
FIG. 9 is a flow diagram of a method of repeatedly sampling an input signal voltage by a multipath bootstrapped sampling circuit.

FIG. 9 depicts the steps in a method 100 of repeatedly sampling an input signal voltage $V_{IN}$ by a multipath bootstrapped sampling circuit 10, 24, 26 for an analog to digital converter. The sampling circuit 10, 24, 26 receives a supply voltage $V_{DD}$ and periodic clock signal CLK, has a ground, and outputs a sampled voltage value $V_{OUT}$. The sampling circuit 10, 24, 26 comprises a sampling transistor MS, first and second bootstrap capacitors $C_{B1}$, $C_{B2}$, and a bootstrap switching network comprising a primary bootstrap path 12 and at least a first auxiliary bootstrap path 14. The bootstrap switching network transitions between a holding phase (block 102) and a tracking phase (block 104).

In the holding phase (block 102), the first and second bootstrap capacitors $C_{B1}$, $C_{B2}$ are charged to the supply voltage $V_{DD}$ by connecting them between the supply voltage $V_{DD}$ and ground. Also, ground is applied to a gate terminal of only the sampling transistor MS by the primary bootstrap path 12. In the tracking phase (104) the first and second bootstrap capacitors $C_{B1}$, $C_{B2}$ are disconnected from the supply voltage $V_{DD}$. Also, the sum of a voltage on the first bootstrap capacitor $C_{B1}$ and the analog input signal voltage $V_{IN}$ is applied to the gate terminal of only the sampling transistor MS by the primary bootstrap path 12.

As described and claimed herein, and as indicated in FIG. 9 by the work "only" being underlined, the primary bootstrap path 12 drives only the gate terminal of the sampling transistor MS, and no other transistor. The first auxiliary bootstrap path 14 drives the gate terminals of one or more transistors in the bootstrap switching network, e.g., the transistors that connect bootstrap capacitors $C_{B1}$, $C_{B2}$ to the supply voltage $V_{DD}$. Other transistors in the switching network are driven by the phase signal p1 or the bootstrapping phase signal p1_b.

As discussed above, the high frequency, multipath, bootstrapped sampling circuits 10, 24, 26 according to embodiments of the present invention find particular utility in Analog to Digital Converter (ADC) circuits. FIGS. 1 and 2 present conceptual and block diagram views of a time-interleaved ADC, which is one of many ADC architectures that benefit from improved linearity and hence accuracy at high frequencies. Those of skill in the art may readily incorporate multipath, bootstrapped sampling circuits 10, 24, 26 according to embodiments of the present invention into numerous alternative ADC architectures, given the teachings of the present disclosure.

One important application of highly linear, high-frequency ADCs is wireless communication. Advanced wireless communication networks (e.g., 3GPP 5G networks) will modulate RF carriers in the millimeter wave bands of 24-86 GHz, using complex modulation schemes that require high accuracy in DAC and ADC operation. These networks, and devices that access them, will require high-frequency ADCs with high linearity—such as the multipath, bootstrapped sampling circuits 10, 24, 26 according to embodiments of the present invention—in transceiver circuits at both the network and device ends of the air interface.

Figure 10:
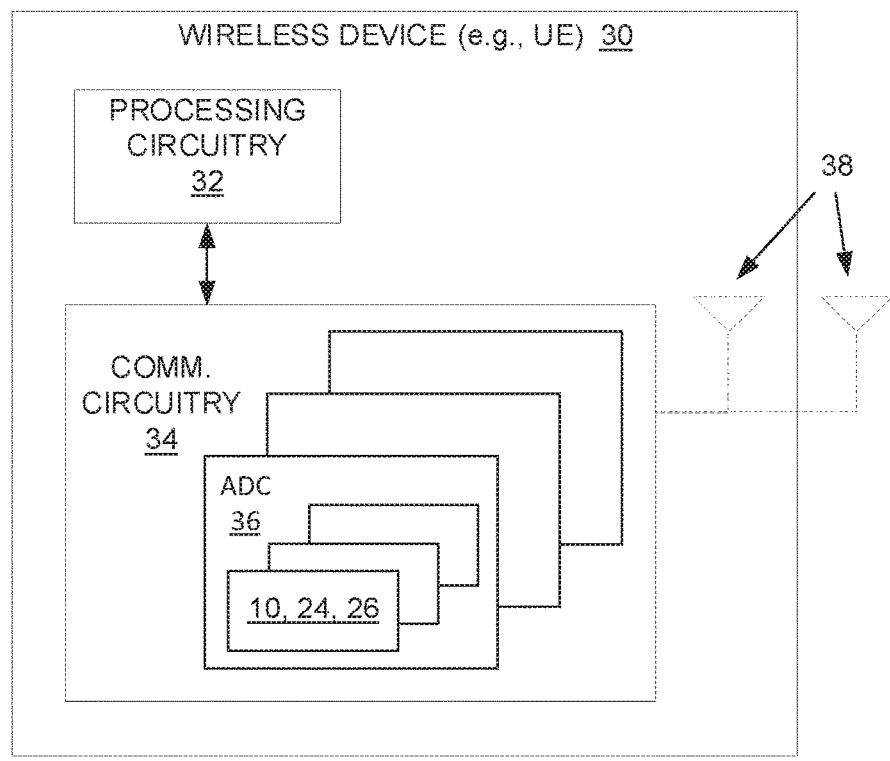
FIG. 10 is a block diagram of a wireless device.

FIG. 10 depicts a wireless device 30 operative in a wireless communication network, such as a 3GPP cellular network. A wireless device 30 is any type device capable of communicating with a base station or access point over a Radio Frequency (RF) air interface. A wireless device 30 may therefore refer to a machine-to-machine (M2M) device, a machine-type communications (MTC) device, a Narrowband Internet of Things (NB IoT) device, etc. The wireless device 30 may also be a User Equipment (UE); however it should be noted that the UE does not necessarily have a "user" in the sense of an individual person owning and/or operating the device. A wireless device 30 may also be referred to as a radio device, a radio communication device, a wireless communication device, a wireless terminal, or simply a terminal. A term wireless device 30 is understood to include device-to-device UEs or devices, machine-type devices, or devices capable of machine-to-machine communication, sensors equipped with a radio network device, wireless-enabled table computers, mobile terminals, smart phones, laptop-embedded equipped (LEE), laptop-mounted equipment (LME), USB dongles, wireless customer-premises equipment (CPE), and the like.

In some embodiments, the wireless device 30 includes a user interface (not shown) which may include a display, touchscreen, keyboard or keypad, microphone, speaker, and the like. In other embodiments, such as in many M2M, MTC, or NB IoT scenarios, the radio network device 30 may include only a minimal, or no, user interface. The wireless device 30 includes processing circuitry 32 and communications circuitry 34. To enable accurate and reliable operation at high frequencies, the communications circuitry 34 includes one or more ADCs 36, at least one of which includes one or more multipath, bootstrapped sampling circuits 10, 24, 26, as described and claimed herein. The wireless device 30 includes one or more antennas 38 to effect wireless communication across an air interface to one or more radio network nodes or other devices 30. As indicated by the dashed lines, the antenna(s) 38 may protrude externally from the wireless device 30, or the antenna(s) 38 may be internal. Although not depicted, those of skill in the art understand that the wireless device 30 may also include other circuits such as a graphics processor, camera, satellite navigation signal receiver circuitry, and the like.

Figure 11:
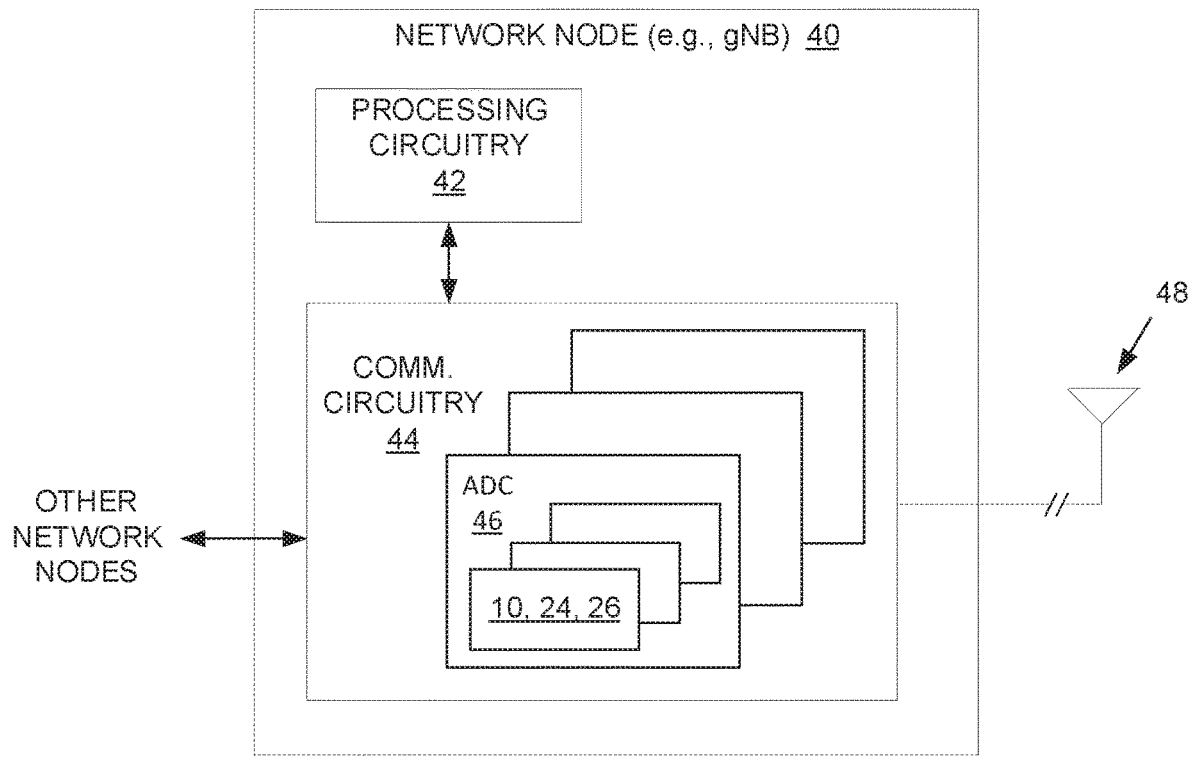
FIG. 11 is a block diagram of a network node.

FIG. 11 depicts a network node 40 operative in a wireless communication network such as a 3GPP 4G or 5G network. The network node 40 may be, for example, a gNB base station of a 5G network. The network node 10 includes processing circuitry 42 and communication circuitry 44 operative to exchange data with other network nodes. The communication circuitry 44 is further operative to communicate wirelessly with wireless devices 30 across an RF air interface via one or more antennas 48. As those of skill in the art are aware, and as indicated by the broken connecting line, the antenna(s) 48 may be physically located separately from the network node 40, such as mounted on a tower, building, or the like. To enable accurate and reliable operation at high frequencies, the communications circuitry 44 includes one or more ADCs 34, at least one of which includes one or more multipath, bootstrapped sampling circuits 10, 24, 26, as described and claimed herein.

In the wireless device 30 or network node 40, the processing circuitry 32, 42 may comprise any sequential state machine operative to execute machine instructions stored as machine-readable computer programs in memory, such as one or more hardware-implemented state machines (e.g., in discrete logic, FPGA, ASIC, etc.); programmable logic together with appropriate firmware; one or more stored-program, general-purpose processors, such as a microprocessor or Digital Signal Processor (DSP), together with appropriate software; or any combination of the above.

In the wireless device 30 or network node 40, the communication circuitry 34, 44 may comprise one or more transceivers used to communicate with one or more other transceivers via a Radio Access Network according to one or more communication protocols known in the art or that may be developed, such as IEEE 802.xx, CDMA, WCDMA, GSM, LTE, NR, UTRAN, WMax, or the like. The communication circuitry 34, 44 implements transmitter and receiver functionality appropriate to the Radio Access Network links (e.g., frequency allocations and the like). In the network node 40, the communication circuitry 44 may further comprise a receiver and transmitter interface used to communicate with one or more other nodes over a communication network according to one or more communication protocols known in the art or that may be developed, such as a 3GPP-defined interface, Ethernet, TCP/IP, SONET, SIP, ATM, or the like. The communication circuitry 44 implements receiver and transmitter functionality appropriate to the communication network links (e.g., optical, electrical, and the like).

Embodiments of the present invention present numerous advantages over bootstrapped sampling circuits of the prior art. By providing multiple bootstrap paths 12, 14, 20, 22, the parasitic capacitance can be allocated. By driving only one load by the primary bootstrap path 12 (the gate terminal of the sampling transistor MS), the parasitic capacitance associated with this driving node is absolutely minimized. By driving other transistors in the bootstrap switching network from one or more auxiliary bootstrap paths 14, 20, 22, the parasitic capacitance associated with those connections is kept off of the primary bootstrap path 12, and hence does not load the sampling transistor MS at high frequencies. Furthermore, the auxiliary bootstrap paths 14, 20, 22, and splitting the bootstrap capacitance into two $C_{B1}$, $C_{B2}$ (or more), allow bulk terminals of transistors in the primary bootstrap path 12 to be connected off of the primary bootstrap path 12, further reducing parasitic capacitance. In some embodiments, one or more additional auxiliary bootstrap paths 20, 22 can be added, allowing the driving circuits to be optimized to each transistor. Additional auxiliary bootstrap paths 20, 22 also allow for distributing the bootstrap capacitance, for further optimization. Distribution of the bulk terminal connections is another parameter than can be varied as required or desired for different applications. By absolutely minimizing the parasitic capacitance in the primary bootstrap path 12, the sampling transistor MS operates with the highest linearity, and hence accuracy, at very high frequencies.

As used herein, the terms "transistor," "switch," and MOSFET are synonymous. The transistor states ON and OFF mean having a conductive and non-conductive channel, respectively. The term "drive" used as a verb means to apply a voltage to the gate terminal of a transistor to control its channel conductance. The term "configured to" means set up, organized, adapted, or arranged to operate in a particular way; the term is synonymous with "designed to."

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A multipath bootstrapped sampling circuit for an analog to digital converter receiving a supply voltage and periodic clock signal, having a ground, sampling an analog input signal voltage, and outputting a sampled voltage value, the sampling circuit comprising:
    a sampling capacitor;
    a sampling transistor interposed between the sampling capacitor and the analog input signal voltage;
    first and second bootstrap capacitors; and
    a bootstrap switching network configured to periodically transition between a holding phase and a tracking phase in response to the periodic clock signal, and further configured to:
        in the holding phase, charge the bootstrap capacitors to the supply voltage by connecting them between the supply voltage and ground, and isolate the sampling capacitor by applying ground to a gate terminal of the sampling transistor; and
        in the tracking phase, disconnect the bootstrap capacitors from the supply voltage and apply a sum of the first capacitor voltage and analog input signal voltage to the gate terminal of the sampling transistor, thereby connecting the sampling capacitor to the analog input voltage;
    wherein the bootstrap switching network comprises
        a primary bootstrap path connected to the first bootstrap capacitor and driving only the gate terminal of the sampling transistor; and
        at least a first auxiliary bootstrap path driving gate terminals of one or more other transistors in the bootstrap switching network.

2. The multipath bootstrapped sampling circuit of claim 1 wherein bulk terminals of one or more transistors in the first bootstrap path are connected to the auxiliary bootstrap path.

3. The multipath bootstrapped sampling circuit of claim 1 wherein the second bootstrap capacitor is connected to the first auxiliary bootstrap path.

4. The multipath bootstrapped sampling circuit of claim 1 further comprising:
    a first inverter connected between the supply voltage and ground, and configured to generate a phase signal from the periodic clock signal, wherein the phase signal is connected to the gate terminal of at least one transistor of the switching network; and
    a second inverter connected between the supply voltage and the input signal voltage, and configured to generate a bootstrapping phase signal from the periodic clock signal, wherein the bootstrapping phase signal is connected to the gate terminal of at least one transistor of the switching network.

5. The multipath bootstrapped sampling circuit of claim 1 wherein the bootstrap switching network further comprises at least a second auxiliary bootstrap path driving gate terminals of one or more transistors in the switching network.

6. The multipath bootstrapped sampling circuit of claim 5 further comprising a third bootstrap capacitor connected to the second auxiliary bootstrap path, and wherein the bootstrap switching network is configured to also charge the third bootstrap capacitor to the supply voltage during the holding phase.

7. The multipath bootstrapped sampling circuit of claim 1 wherein driving only the sampling transistor by the primary bootstrap path, and driving all other transistors by one or more auxiliary bootstrap paths or a phase or bootstrapping phase signal, improves linearity of the sampling circuit at high frequency by reducing parasitic capacitance at the sampling transistor gate terminal.

8. The multipath bootstrapped sampling circuit of claim 1 wherein the one or more transistors in the bootstrap switching network driven by at least the first auxiliary bootstrap path include transistors that connect bootstrap capacitors to the supply voltage.

9. A method of repeatedly sampling an input signal voltage by a multipath bootstrapped sampling circuit for an analog to digital converter, the sampling circuit receiving a supply voltage and periodic clock signal, having a ground, and outputting a sampled voltage value, the sampling circuit comprising a sampling capacitor, a sampling transistor interposed between the sampling capacitor and an analog input signal voltage, first and second bootstrap capacitors, and a bootstrap switching network comprising a primary bootstrap path and at least a first auxiliary bootstrap path, the method comprising:
- in a holding phase of the bootstrap switching network, charging the first and second bootstrap capacitors to the supply voltage by connecting them between the supply voltage and ground, and applying ground to a gate terminal of the sampling transistor by the primary bootstrap path; and
- in a tracking phase of the bootstrap switching network, disconnecting the first and second bootstrap capacitors from the supply voltage and applying a sum of a voltage on the first bootstrap capacitor and the analog input signal voltage to the gate terminal of the sampling transistor by the primary bootstrap path;
- wherein the primary bootstrap path drives only the gate terminal of the sampling transistor, and the first auxiliary bootstrap path drives the gate terminals of one or more other transistors in the bootstrap switching network.

10. The method of claim 9 wherein bulk terminals of one or more transistors in the first bootstrap path are connected to the auxiliary bootstrap path.

11. The method of claim 9 wherein the second bootstrap capacitor is connected to the first auxiliary bootstrap path.

12. The method of claim 9 further comprising:
- generating a phase signal from the periodic clock signal in a first inverter connected between the supply voltage and ground, and driving the gate terminal of at least one transistor of the switching network with the phase signal; and
- generating a bootstrapping phase signal from the periodic clock signal in a second inverter connected between the supply voltage and the input signal voltage, and driving the gate terminal of at least one transistor of the switching network with the bootstrapping phase signal.

13. The method of claim 9 further comprising driving gate terminals of one or more transistors in the bootstrap switching network that connect bootstrap capacitors to the supply voltage by at least a second auxiliary bootstrap path.

14. The method of claim 13 further comprising a third bootstrap capacitor connected to the second auxiliary bootstrap path, and wherein the bootstrap switching network is configured to also charge the third bootstrap capacitor to the supply voltage during the holding phase.

15. The method of claim 9 wherein driving only the sampling transistor by the primary bootstrap path, and driving all other transistors by one or more auxiliary bootstrap paths or a phase or bootstrapping phase signal, improves linearity of the sampling circuit at high frequency by reducing parasitic capacitance at the sampling transistor gate terminal.

16. The method of claim 9 wherein the one or more transistors in the switching network driven by at least the first auxiliary bootstrap path include transistors that connect bootstrap capacitors to the supply voltage.

17. An Analog to Digital Converter, comprising:
one or more multipath bootstrapped sampling circuits;
wherein each multipath bootstrapped sampling circuit receives a supply voltage and periodic clock signal and has a ground, and each multipath bootstrapped sampling circuit samples an analog input signal voltage and outputs a sampled voltage value; and
wherein each multipath bootstrapped sampling circuit comprises
- a sampling capacitor;
- a sampling transistor interposed between the sampling capacitor and the analog input signal voltage;
- first and second bootstrap capacitors; and
- a bootstrap switching network configured to periodically transition between a holding phase and a tracking phase in response to the periodic clock signal, and further configured to:
  - in the holding phase, charge the bootstrap capacitors to the supply voltage by connecting them between the supply voltage and ground, and isolate the sampling capacitor by applying ground to a gate terminal of the sampling transistor; and
  - in the tracking phase, disconnect the bootstrap capacitors from the supply voltage and apply a sum of the first capacitor voltage and analog input signal voltage to the gate terminal of the sampling transistor, thereby connecting the sampling capacitor to the analog input voltage;
wherein the bootstrap switching network comprises
- a primary bootstrap path connected to the first bootstrap capacitor and driving only the gate terminal of the sampling transistor; and
- at least a first auxiliary bootstrap path driving gate terminals of one or more other transistors in the bootstrap switching network.

18. A wireless communication apparatus, comprising:
processing circuitry; and
communication circuitry operatively connected to the processing circuitry and including one or more Analog to Digital Converters, at least one of which includes one or more multipath bootstrapped sampling circuits;
wherein each multipath bootstrapped sampling circuit receives a supply voltage and periodic clock signal and has a ground, and each multipath bootstrapped sampling circuit samples an analog input signal voltage and outputs a sampled voltage value; and
wherein each multipath bootstrapped sampling circuit comprises
- a sampling capacitor;
- a sampling transistor interposed between the sampling capacitor and the analog input signal voltage;
- first and second bootstrap capacitors; and
- a bootstrap switching network configured to periodically transition between a holding phase and a tracking phase in response to the periodic clock signal, and further configured to:
  - in the holding phase, charge the bootstrap capacitors to the supply voltage by connecting them between the supply voltage and ground, and isolate the sampling capacitor by applying ground to a gate terminal of the sampling transistor; and
  - in the tracking phase, disconnect the bootstrap capacitors from the supply voltage and apply a sum of the first capacitor voltage and analog input signal voltage to the gate terminal of the sampling transistor, thereby connecting the sampling capacitor to the analog input voltage;

wherein the bootstrap switching network comprises a primary bootstrap path connected to the first bootstrap capacitor and driving only the gate terminal of the sampling transistor; and at least a first auxiliary bootstrap path driving gate terminals of one or more other transistors in the bootstrap switching network.

19. The apparatus of claim 18 wherein the wireless communication apparatus is a User Equipment operative in a wireless communication network.

20. The apparatus of claim 18 wherein the wireless communication apparatus is a base station node of a wireless communication network.

* * * * *